United States Patent [19]

Afzali-Ardakani et al.

[11] Patent Number: 4,915,519

[45] Date of Patent: Apr. 10, 1990

[54] DIRECT NEGATIVE FROM RESISTIVE RIBBON

[75] Inventors: Ali Afzali-Ardakani, White Plains; Mukesh Desai, Fishkill; Keith S. Pennington, Somers, all of N.Y.

[73] Assignee: International Business Machines Corp., Armonk, N.Y.

[21] Appl. No.: 115,227

[22] Filed: Oct. 30, 1987

[51] Int. Cl.⁴ ............................................... B41J 3/20
[52] U.S. Cl. ..................................... 400/120; 101/467; 400/241.1; 156/247; 156/273.9; 156/379.7; 156/584; 430/200; 428/195; 428/207; 428/209; 428/913; 346/1.1; 346/76 PH; 346/135.1
[58] Field of Search ...................... 400/241.1, 696, 120; 101/467, 451, 460, 461; 346/1.1, 76 PH, 135.1; 430/200; 428/195, 207, 209, 913; 156/247, 273.9, 379.7, 584

[56] References Cited

U.S. PATENT DOCUMENTS

| | | | |
|---|---|---|---|
| 2,664,043 | 12/1953 | Dalton | 346/135.1 X |
| 3,255,039 | 6/1966 | Dalton | 346/135.1 |
| 3,483,027 | 12/1969 | Ritzerfeld | 101/401.1 |
| 3,554,125 | 1/1971 | Van Dorn | 101/467 |
| 3,964,389 | 6/1976 | Peterson | 101/467 |
| 4,123,578 | 10/1978 | Perrington | 430/200 X |
| 4,384,797 | 5/1983 | Anderson | 400/696 |
| 4,400,100 | 8/1983 | Aviram | 400/241.1 |
| 4,491,431 | 1/1985 | Aviram | 400/241.1 |
| 4,502,065 | 2/1985 | Moriguchi | 430/200 X |
| 4,525,722 | 6/1985 | Sachdev | 400/241.1 |
| 4,631,110 | 12/1986 | Tsumura | 156/584 |
| 4,800,397 | 1/1989 | Afzali-Ardakani | 346/1.1 |
| 4,810,119 | 3/1989 | Afzali-Ardakani | 400/120 X |
| 4,836,105 | 6/1989 | Hoekstra | 400/120 X |

FOREIGN PATENT DOCUMENTS

| | | | |
|---|---|---|---|
| 13168 | 2/1981 | Japan | 101/467 |
| 193154 | 11/1983 | Japan | 101/467 |
| 1169289 | 7/1986 | Japan | 400/241.1 |

OTHER PUBLICATIONS

IBM; IBM Tech. Disc.; vol. 30, No. 3, Aug. 1987, p. 1109.

Primary Examiner—Paul T. Sewell
Attorney, Agent, or Firm—Sughrue, Mion, Zinn, Macpeak & Seas

[57] ABSTRACT

An improved apparatus and process are described in which a direct negative is formed using commercially available multi-stylus recording heads. A negative precursor comprised of a transparent support and an opaque thermoplastic ink layer carried thereon, is brought into contact with an ink receiving medium comprised of a resistive layer and a thin conductive ink receiving layer thereon. Electrical currents are provided by the recording styli of the multi-stylus recording head to the resistive layer to provide sufficient heat to soften regions of the opaque ink brought into contact with the conductive layer, by which regions of said opaque ink are transferred to the ink receiving conductive layer. In this manner, a pattern of opaque ink regions is removed from the surface of said transparent support, whereby a direct negative is formed having light opaque and light transparent regions.

18 Claims, 1 Drawing Sheet

U.S. Patent   Apr. 10, 1990   4,915,519
FIG. 1
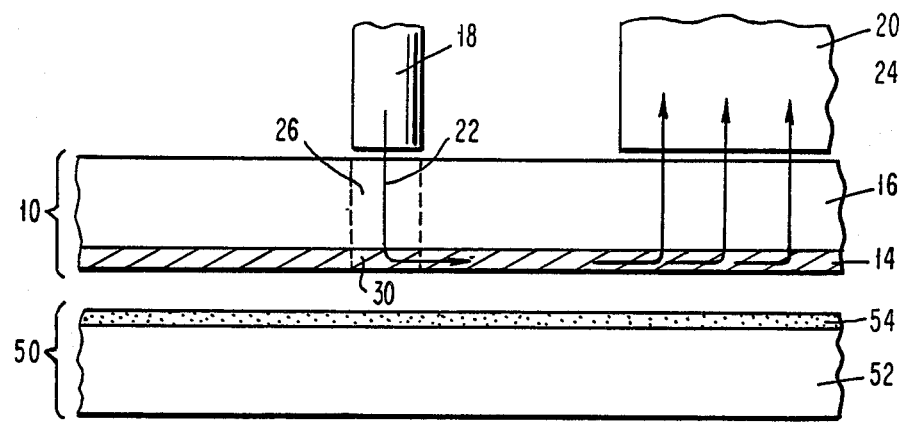
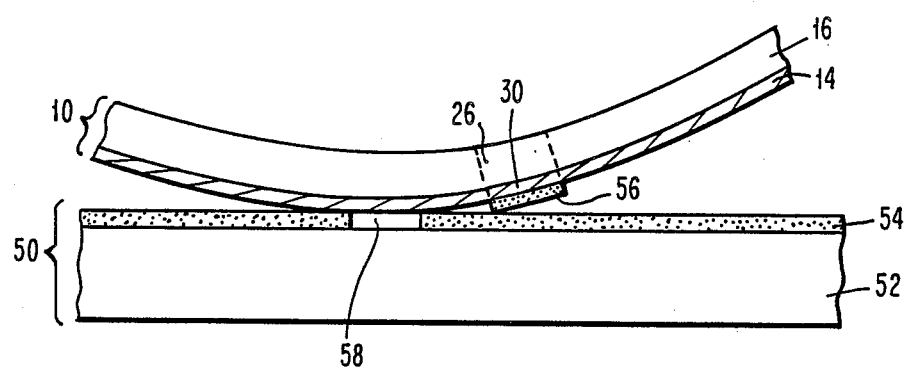
FIG. 2
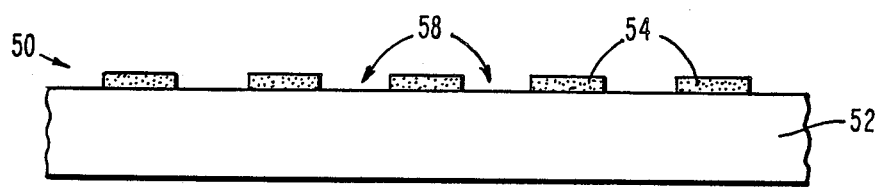
FIG. 3

DIRECT NEGATIVE FROM RESISTIVE RIBBON

FIELD OF THE INVENTION

This invention relates to printing techniques and apparatus and more particularly to the production of a direct negative using a modified thermal transfer resistive ribbon.

BACKGROUND ART

Both resistive ribbon thermal transfer printing and electroerosion printing are known in the art for providing high resolution, good quality printing, especially of the type that is used in computer terminals and typewriters. Resistive ribbon thermal transfer printing is a type of thermal transfer printing in which a thin ribbon is used. The ribbon is generally comprised of either three or four layers, including a support layer a layer of fusible ink that is brought into contact with the receiving medium (such as paper), and a layer of electrically resistive material. In a variation, the resistive layer is thick enough to be the support layer, so that a separate support layer is not needed. A thin electrically conductive layer is also optionally provided to serve as a current return.

In order to transfer ink from the fusible ink layer to the receiving medium, the layer of ink is brought into contact with the receiving surface. The ribbon is also contacted by an electrical power supply and selectively contacted by a thin printing stylus at those points opposite the receiving surface (paper) where it is desired to print. When current is applied via the thin printing stylus, it travels through the resistive layer and causes localized resistive heating which in turn melts a small volume of ink in the fusible ink layer. This melted ink is then transferred to the receiving medium to produce printing. Resistive ribbon thermal transfer printing is described in U.S. Pat. Nos. 3,744,611; 4,309,117; 4,400,100; 4,491,431; and 4,491.432.

The materials used in resistive printing ribbons are well known in the art. For example, the resistive layer is commonly a carbon or graphite-filled polymer, such as polycarbonate. The thin current return layer is a metal, such as Al. The thermally fusible inks are comprised of various resins having a colorant therein, and typically melt at about 100 degrees C. Printing currents of approximately 20-30 mA are used in the present, commercially available printers, such as those sold by IBM Corporation under the name QUIETWRITER TM.

The QUIETWRITER TM typewriter employs a correction feature whereby "printed" ink is transferred from printed paper to ribbon. An unused section of ribbon is positioned over the image to be corrected. The printhead is then swept over the ribbon as if to print a block image over the character to be corrected. The energy applied to the block is lower than that used for printing but is sufficiently high to produce a bond to the image to be corrected. A correction roller is introduced to delay peeling of ribbon from the page. This allows formation of a stronger bond between the ribbon and the image to be corrected before peeling occurs.

Electroerosion printing is also well known in the art, as exemplified by U.S. Pat. No. 3,786,518; 3,861,952; 4,339,758; and 4,086,853. Electroerosion printing is known as a technique which is suitable to make direct offset masters and direct negatives. Generally, the electroerosion recording medium is comprised of a support layer and a thin conductive layer. The support layer can be, for example, paper, polyesters such as Mylar TM, etc., while the thin conductive layer is a metal, such as Al. In order to print portions of the thin Al layer are removed by an electric arc. To do so, a printing head comprising multiple styli, typically tungsten wire styli of diameters 0.3-0.5 mil, is swept across the electroerosion medium while maintaining good electrical contact between the styli tips and the aluminum layer. When an area is to be printed, a pulse is applied to the appropriate styli at the correct time resulting in an arc between the energized styli and the aluminum layer. This arc is hot enough to cause local removal of the aluminum by disintegration, e.g., vaporization.

Practical electroerosion media require a base layer between the supporting substrate and the thin metal layer, as well as an overlayer on the thin metal layer. The base layer and the overlayer are used to prevent scratching of the aluminum layer in areas where no arc is applied, and to minimize head wear and fouling. Typically, the base layer is a hard layer consisting of hard particles embedded in a suitable binder, such as silica in a cross-linked cellulosic binder. The overlayer is typically a lubricating, protective overlayer comprised of a polymer including a solid lubricant, such as graphite in a cellulosic binder.

Depending upon the properties of the various layers in the electroerosion medium, direct offset masters and direct negatives can be formed. For example, a direct negative can be comprised of a transparent polymer support layer and a thin aluminum layer directly deposited on the support layer. After electroerosion writing the Al layer is patterned. Since the Al layer is reflective to light while the substrate is transparent, the electroerosion writing has produced the required light opaque and light transparent regions needed to make a negative. The electroeroded negative can be used in a platemaking machine of the type used to make a "master", such as that used in offset photolithography. The master would be made by contact printing using the electroeroded negative.

A direct master can be easily made by electroerosion in order to simplify the process by which masters or plates, are made in conventional offset lithography shops. In such a structure the electroerosion recording medium is typically comprised of the support layer, a base layer which is hydrophobic, an Al layer and an optional overlayer. When the Al layer is electroeroded and the overlayer removed, regions of the Al layer (unwritten areas) and the base layer (written areas) will be exposed. Since the Al layer is hydrophilic, the unwritten areas having Al will attract water but repel organic inks. The written areas of the recording medium, being comprised of the hydrophobic base layer, will repel water but will accept organic based inks. A direct master is thereby produced since the information to be printed has been successfully mapped onto the master in terms of surface affinity to water and ink.

If the problem of scratching of the Al layer in undesired areas were not present, the substrate-Al layer combination could itself be used for direct master and direct negative applications. For a direct negative, a clear polymer sheet, typically polyester, can be used as the substrate. Since this is transparent to light while the Al is reflective, a direct negative would be obtained. Also, since the Al is hydrophilic and the polyester substrate is hydrophobic, a direct master would also be created in principle.

Heretofore, electroerosion has been used to provide lithographic printing masters and direct negatives, but the lifetimes of these masters and negatives in actual use is not as extensive as when the traditional printing plates are made using various chemical treatments to prepare a photosensitized plate.

Generally, the prior art has not provided a technique for creating direct negatives using equipment which is energy efficient and suitable for processing using commercially available apparatus.

SUMMARY OF THE INVENTION

Accordingly, it is a primary object of this invention to provide an improved technique for preparing a direct negative.

It is another object of this invention to provide a process for preparing a direct negative using resistive ribbon technology.

Still another object of this invention is to provide an improved technique for producing direct negatives without the need for electroerosion processing or the need for standard negative printing plate preparation.

It is another object of this invention to provide a process whereby low levels of electrical energy are used to form a direct negative.

It is yet another object of this invention to provide a direct negative production technique providing good resolution through use of modified resistive ribbon thermal transfer materials and processes.

It is another object of this invention to provide a direct negative usable in plate making machines for producing "masters" used in offset photolithography.

Other objects of the present invention will be apparent to the skilled artisan from the detailed description of the invention hereinbelow.

Accordingly, the present invention provides a method for producing a direct negative on a transparent substrate comprising applying electrical current pulses through selected recording styli of a multi stylus recording head located in contact with a resistive layer of a resistive ribbon for thermal transfer printing comprising said resistive layer and a thin conductive layer, said thin conductive layer being in contact with a heat softenable opaque ink layer on the surface of said transparent substrate, whereby heat generated in said resistive layer by said electrical current pulses softens regions of said ink layer which in turn transfer to said conductive layer, thereby providing light transparent and light opaque regions of said substrate forming a direct negative.

In a preferred embodiment of the present invention, the transparent substrate comprises a layer of thermoplastic opaque ink.

In another preferred embodiment of the present invention, the thin conductive layer is formed of metal.

In another preferred embodiment of the present invention, the resistive layer is self-supporting.

BRIEF DESCRIPTION OF THE DRAWING

FIG. 1 depicts a transfer apparatus of the present invention, wherein electrical current from a painting stylus passes through resistive and conductive layers of an ink receiving medium and causes ink on a surface of a negative precursor and in contact with the conductive layer to melt.

FIG. 2 depicts a detailed view of the transfer of a single ink indicia in accordance with the present invention.

FIG. 3 depicts a direct negative formed in accordance with the practice of the present invention.

DETAILED DESCRIPTION OF THE INVENTION

In this invention, a multi-stylus printing head of the type used in resistive ribbon printing or electroerosion printing is used to provide localized currents in a resistive layer of an ink receiving medium. The ink receiving medium is comprised of the resistance layer and a thin conductive metal layer to which a heat softenable ink will adhere.

FIG. 1 shows an apparatus for practicing the present invention where the ink receiving medium 10 is comprised of a resistive layer 16 and a conductive ink receiving layer 14. In order to direct electrical currents into the resistive layer 16, thereby heating the resistive layer which in turn locally transfers heat to the ink receiving layer 14, a multi-stylus head of the type used in either resistive ribbon printing or electroerosion printing is provided. This type of head is well known in the art and is comprised of a plurality of printing styli 18 and large contact (ground) electrode 20. When a select pattern of printing styli 18 is energized, the electrical currents, represented by the arrows 22 will flow through the resistive layer and return to the ground electrode via the conductive layer 14, as represented by arrows 24. If the current density is sufficiently high in the resistive layer regions in the vicinity of the printing stylus 18, intense resistive heating will occur and a small region 26 of the resistive layer 16 will conduct sufficient heat to about coextensive region 30, in conjunction with heat generated in region 30 by the passage of the electric current therethrough, to melt or sufficiently soften a region of heat softenable ink layer 4 when it is brought into contact with hot region 30. Ink layer 54 is coated on transparent substrate 52 of negative precursor 50. Currents of about 10 to 50, preferably about 20 to 30 mA, are usable within the concepts of the present invention. The electrical current pulses will have durations of about 1 to 100 msec.

In FIG. 2, the reference numerals 14, 16, 26, 30, 50, 52 and 54 depict the same elements as in FIG. 1. In FIG. 2, the surface of heat softenable ink layer 54 is brought into contact with conductive layer 14 while or shortly after the stylus or styli selected to heat area 26 have been sufficiently energized to provide a temperature within area 30 high enough so that a softening or flow of area 56 occurs as it contacts area 30 of conductive ink receiving layer 14, whereby ink indicia 56 is transferred onto ink receiving layer 14. With removal of portion 56 of layer 54, light transparent region 58 is provided on transparent substrate 52. As depicted in FIG. 3, a plurality of predetermined light-transparent regions 58 is formed on substrate 52, whereby a negative patterned image is provided changing negative precursor 50 into a direct negative. Light is blocked by opaque areas 54 while light is transmitted through transparent support 52 via open areas 58

Ink receiving medium 10 can be a conventional thermal transfer resistant ribbon of the type comprising a resistive layer and a conductive layer, without the presence of the fusible ink layer found over the conductive layer. Thus, the resistive layer 16 has a resistivity similar to that of the resistive layers in resistive printing ribbons, typically from about 200 to 1200 ohms/sq. The resistive layer's thickness will depend upon its composition, since preferably the resistive layer not only functions as a heat transfer means, but is self-supporting and also carries thereon the conductive, i.e., metal, layer. Thus, the resistive layer is selected so that it possesses sufficient physical integrity, including internal coherence, so that it can be fabricated into a continuous ribbon for passage through a resistive printing machine. In addition, the resistive layer must be of a character to withstand the physical and chemical abuse that will arise during whatever technique is employed to provide the conductive layer thereon. This type of resistive layer in known in the art, since the art teaches resistive printing ribbons where an internal support is not employed, but the ribbon can consist of a polymer binder loaded with conductive particles. For example, a resistive layer can be formed of a polymer such as polycarbonate, polyetherimide, polyimide, polyester and so forth loaded with 15 to 40% (by weight) of a conductive particle such as carbon, graphite, nickel powder, nickel coated graphite nickel, coated mica and the like. Generally, a resistive layer having a thickness of about 10 to 30 micrometers will provide sufficient physical integrity for a flexible ribbon that can be provided within a cartridge for use with standard resistive printing and electroerosion equipment. Where desired, a support layer as is known in the art can be employed including polyester, polytetrafluoroethylene, etc., usually of a thickness of about 1 micron.

The ink receiving conductive layer is usefully a metal layer, including aluminum, gold, nickel, chromium, copper, mixtures thereof, stainless steel, etc., as long as it will attract and hold the softened ink regions. Its thickness will be up to about 1500 Å, say about 250 to 1500 Å.

A typical conventional thermal transfer resistive ribbon comprises a resistive layer of 15 to 18 microns thickness, on which aluminum as a metal conductive layer has been vapor deposited up to a thickness of about 100 nanometers, on top of which a thermoplastic ink of about 5 microns in thickness has been coated. This structure without the fusible ink layer is usable in the practice of the present invention. Thus, standard resistive ribbon conductive layers are usable herein since thermoplastic inks normally adhere thereto. The ink receptive or receiving surface comprises a surface having a greater affinity for all of the thickness of the softened ink than the transparent support of the negative precursor.

The negative precursor comprises a transparent substrate, usefully formed of a plastic such as polyester, and a layer of thermoplastic ink thereon, which ink is usefully of the type which otherwise would be found as a top layer of a thermal transfer resistive ribbon. These ink transfer layers usually comprise a wax or a thermoplastic resin, carbon black pigment, and perhaps a dye. Ink compositions are described in U.S. Pat. No. 4,268,368. Polyamide-carbon black mixtures melting at 90°-100° C. are suitably employed. One composition would be an ink containing polyamide such as Versamide 940 of General Mills and carbon black. An ink containing about 9.4 grams Versamide 940 and 2.6 grams of carbon black can be spray coated onto a transparent polymer substrate.

A suitable transparent support is a polymer film such as a polyester comprising polyethylene terephthalate of commercially available thickness, say about 80 to 150 microns, since only handability within a resistive printing or electroerosion printing environment is what is required. The ink layer can be as thin as possible, say 1 to 5 microns, since it is essentially completely removed from the transparent support when contacted with the heated conductive layer. A thinner ink layer improves resolution, believed due to reduced lateral spreading of ink on the transparent support. With the practice of the present invention changes in optical density of from 3.0 to 1.3 in non-image/image layers have been observed.

As alternate embodiments, an ink release layer could be applied to the transparent support or the conductive layer, respectively. Also, other intermediate layers may be present between the ink layer and the transparent support, as long as any such layer is transparent. Further, where some ink remains on the imaged areas od the support, a mild, quick wash could be carried out as long as the wash fluid did not remove sufficient non-image area ink to alter the desired pattern.

The direct negative resulting from the practice of this invention can be directly used in master plate-making machines to create lithographic masters.

Variations of the invention will be apparent to the skilled artisan.

We claim:

1. A method for producing a direct negative, which method comprises:
    locating a multi-stylus recording head capable of providing electrical current pulses in selected ones of said recording styli in contact with a resistive layer of an ink receiving medium comprising said resistive layer and thereon a thin ink receiving metal layer;
    applying electrical current pulses through selected ones of said recording styli to produce high density localized currents in the regions of said resistive layer in contact with said selected energized styli, said electrical currents providing sufficient resistive heating to heat regions of said ink receiving metal layer about coextensive with said resistive layer regions;
    contacting said heated ink receiving metal layer with a negative precursor comprising a transparent support carrying thereon a thin layer of an opaque heat softenable ink, with said layer of ink being in contact with said ink receiving metal layer, while maintaining through said resistive heating said regions of said metal layer at a temperature sufficient to soften said ink regions in contact therewith sufficiently to transfer essentially the entire cross sections of said ink regions to said ink/receiving metal layer, thereby forming a direct negative in said transparent support having light opaque regions where said opaque ink has not been removed and light transparent regions were said opaque ink has been removed.

2. The method of claim 1 wherein said electrical currents have a magnitude in the range of about 10 to 50 mA.

3. The method of claim 1 wherein said electrical current pulses have durations of about 1 to 100 msec.

4. The method of claim 1 wherein said resistive layer has a thickness in the range of about 10 to 30 micrometers.

5. The method of claim 1 wherein said resistive layer comprises a self-supporting layer of a polymer binder loaded with conductive particles.

6. The method of claim 5 wherein said polymer comprises polycarbonate, polyetherimide, polyimide or polyester.

7. The method of claim 6 wherein said conductive particles comprise carbon, graphite, nickel powder, nickel coated graphite or nickel coated mica.

8. The method of claim 1 wherein said metal layer comprises aluminum, copper, chromium gold, or nickel.

9. The method of claim 8 wherein said metal layer comprises aluminum.

10. The method of claim 1 wherein said negative precursor comprises a transparent polymer support.

11. The method of claim 10 wherein said polymer is a polyester.

12. The method of claim 10 wherein said opaque ink is a thermoplastic opaque ink.

13. The method of claim 12 wherein said thermoplastic ink melts at a temperature of about 90° to 100° C.

14. An apparatus system for forming a direct negative comprising:
- an ink receiving medium comprised of a resistive layer and a thin ink receiving metal layer thereon;
- a multi-stylus recording head for providing patterns of electrical current through selected regions of said resistive layer, where said electrical currents are localized in the regions of said resistive layer contacted by the styli which are energized by said electrical currents, said localized electrical currents being sufficiently dense to provide sufficient resistive heating to heat regions of said metal layer about coextensive with said selected regions of said resistive layer to a temperature sufficient to soften a thermoplastic ink brought in contact therewith, and
- a negative precursor comprising a transparent substrate carrying thereon a layer of an opaque thermoplastic ink.

15. The apparatus system of claim 14 wherein said resistive layer is a polymer binder having conductive particles therein.

16. The apparatus system of claim 15 wherein said metal layer comprises aluminum.

17. The apparatus system of claim 16 wherein said negative precursor comprises a polymer support.

18. The apparatus system of claim 17 wherein said polymer support is formed of a polyester.

* * * * *